US012109625B2

(12) United States Patent
Igarashi et al.

(10) Patent No.: US 12,109,625 B2
(45) Date of Patent: *Oct. 8, 2024

(54) SURFACE-COATED TIN-BASED CERMET CUTTING TOOL IN WHICH HARD COATING LAYER EXHIBITS EXCELLENT CHIPPING RESISTANCE

(71) Applicant: MITSUBISHI MATERIALS CORPORATION, Tokyo (JP)

(72) Inventors: Makoto Igarashi, Naka (JP); Kazutaka Fujiwara, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 766 days.

This patent is subject to a terminal disclaimer.

(21) Appl. No.: 17/279,311

(22) PCT Filed: Sep. 25, 2019

(86) PCT No.: PCT/JP2019/037547
§ 371 (c)(1),
(2) Date: Mar. 24, 2021

(87) PCT Pub. No.: WO2020/067138
PCT Pub. Date: Apr. 2, 2020

(65) Prior Publication Data
US 2022/0055118 A1 Feb. 24, 2022

(30) Foreign Application Priority Data

Sep. 28, 2018 (JP) ................. 2018-185620

(51) Int. Cl.
*B23B 27/14* (2006.01)
*C22C 1/051* (2023.01)
*C22C 29/16* (2006.01)
*C23C 16/34* (2006.01)
(52) U.S. Cl.
CPC ............ *B23B 27/148* (2013.01); *C22C 1/051* (2013.01); *C22C 29/16* (2013.01); *C23C 16/34* (2013.01); *B23B 2228/105* (2013.01)
(58) Field of Classification Search
None
See application file for complete search history.

(56) References Cited

U.S. PATENT DOCUMENTS

| | | | | |
|---|---|---|---|---|
| 4,065,301 A | * | 12/1977 | Tanaka | C22C 29/00 75/238 |
| 5,666,636 A | | 9/1997 | Park et al. | |
| 6,024,776 A | | 2/2000 | Heinrich et al. | |
| 2008/0166527 A1 | * | 7/2008 | Lenander | B23B 27/141 427/249.19 |
| 2009/0274525 A1 | * | 11/2009 | Omori | B23C 5/20 407/119 |
| 2012/0282049 A1 | * | 11/2012 | Okada | C23C 16/56 407/115 |

FOREIGN PATENT DOCUMENTS

| | | |
|---|---|---|
| JP | S49-001364 B | 1/1974 |
| JP | S50-017412 A | 2/1975 |
| JP | S51-065008 A | 6/1976 |
| JP | S51-071809 A | 6/1976 |
| JP | 60-162782 A | 8/1985 |
| JP | S63-109139 A | 5/1988 |
| JP | 04-300104 A | 10/1992 |
| JP | 06-108258 A | 4/1994 |
| JP | 07-088569 B2 | 9/1995 |
| JP | H08176695 A * | 7/1996 |
| JP | 11-511078 A | 9/1999 |
| JP | 2000-355777 A | 12/2000 |
| JP | 2009-269097 A | 11/2009 |
| JP | 2019-137914 A | 8/2019 |
| WO | 97/04143 A1 | 2/1997 |
| WO | 2009/005924 A2 | 1/2009 |

OTHER PUBLICATIONS

M. Gaier et al., "The influence of Mo2C additions on the microstructural development and sintering response of TiN-Ni3Al cermets", International Journal of Refractory Metals and Hard Materials, Elsevier, Amsterdam, NL, vol. 71, Nov. 22, 2017, pp. 262-272. (Apr. 28, 2022 Search Report issued for EP19864304.1).
Supplementary European Search Report mailed Apr. 28, 2022, issued for European Patent Application No. 19864304.1.
Yuji Katsumura et al., "Properties of TiC-TiN cermet," Journal of the Japan Society of Precision Engineering, vol. 46, No. 5, 1980, pp. 553-559. (discussed in the spec).
International Search Report mailed Nov. 26, 2019, issued for PCT/JP2019/037547 and English translation thereof.
International Search Report mailed Apr. 23, 2019 forPCT International Application No. PCT/JP2019/004201.

(Continued)

*Primary Examiner* — Seth Dumbris

(74) *Attorney, Agent, or Firm* — Locke Lord LLP; James E. Armstrong, IV; Nicholas J. DiCeglie, Jr.

(57) ABSTRACT

A surface-coated TiN-based cermet cutting tool is a surface-coated TiN-based cermet cutting tool, in which a TiN-based cermet containing a TiN phase as a hard phase component is used as a body, and a hard coating layer including a titanium carbonitride layer and an aluminum oxide layer is formed on a surface, in which a linear expansion coefficient of the TiN-based cermet is set to $9.0 \times 10^{-6}$ (/K) or more, a thermal conductivity is set to 30 (W/m·K) or more, and a residual compressive stress of the hard coating layer is set to 600 to 2,000 MPa, and particularly 600 to 2,000 MPa even in an as-deposited state by adjusting component composition and the like of the TiN-based cermet.

2 Claims, No Drawings

(56) References Cited

OTHER PUBLICATIONS

Kaidash O.N. et al. "Corrosion Resistance of Cermets based on Titanium Nitride" Soviet Powder Metallurgy and Metal Ceramics, Consultants Bureau, Jan. 1, 1991, pp. 69-73, New York NY, US, vol. 1, No. 337, XP009037366.
European Search Report mailed Oct. 13, 2021 for European Patent Application No. 19754323.4.

* cited by examiner

SURFACE-COATED TiN-BASED CERMET CUTTING TOOL IN WHICH HARD COATING LAYER EXHIBITS EXCELLENT CHIPPING RESISTANCE

TECHNICAL FIELD

The present invention relates to a surface-coated TiN-based cermet cutting tool having excellent chipping resistance.

Priority is claimed on Japanese Patent Application No. 2018-185620, filed Sep. 28, 2018, the content of which is incorporated herein by reference.

BACKGROUND ART

In the related art, for example, a surface-coated TiCN-based cermet cutting tool (hereinafter, referred to as a "coated tool") in which a hard coating layer is coated and formed on a surface of a cermet body (hereinafter, referred to as a "body") representing a titanium carbonitride (hereinafter, shown as TiCN)-based cermet by a chemical vapor deposition method or a physical vapor deposition method is known.

Various proposals have been made in the related art, in order to improve chipping resistance, fracture resistance, wear resistance, and the like of the coated tool.

For example, Patent Document 1, a hard coating layer consisting of one kind of a single layer or two or more kinds of multiple layers of the group consisting of carbides, nitrides, and oxides of Group 4a metals in the Element Periodic Table, and a solid solution body of two or more kinds thereof is formed on a surface of a body configured with a TiCN-based cermet by a PVD method (for example, cluster ion beam method). In Patent Document 1, it is proposed that a compressive residual stress of the hard coating layer formed by the PVD method is set to 0.7 GPa or less to suppress occurrence of peeling of the hard coating layer, thereby improving the fracture resistance of the coated tool.

In Patent Document 2, as a coated tool in which a TiCN-based cermet is used as a body and a hard layer is coated on a surface thereof by a CVD method, a hard coating layer is configured on the surface of the body with one kind of a single layer or two or more kinds of multiple layers of a compound of one kind or two or more kinds of metal elements selected from the group of Group 4a, 5a, and 6a metals in the Periodic Table, Al, and Si, and one kind or two or more kinds of non-metal elements selected from the group consisting of carbon, nitrogen, oxygen, and boron. Then, a surface of the obtained hard coating layer is subjected to a sandblasting treatment or a shot peening treatment, or the surface of the obtained hard coating layer is irradiated with ions. Patent Document 2 proposes that, by the treatment of the surface of the hard coating layer, a tensile residual stress or a compressive residual stress of at least one layer of the hard layer (may also be the entire hard layers) can be set to 9 kgf/mm$^2$ or less. In this coated tool, adhesiveness between the hard layer and the hard layer and between the hard layer and the body is high, wear resistance is also improved, and flank face wear resistance in continuous cutting, especially in minute continuous cutting is excellent.

Patent Document 3 discloses a body (for example, body of a TiC-based cermet, TiCN-based cermet, or the like) of a sintered alloy consisting of at least one kind of hard phase of carbides and nitrides of Group 4a, 5a, and 6a metals in the Periodic Table, and a mutual solid solution body thereof, and a binder phase having a Ni, Co, or Ni—Co alloy as a main component. Then, a coated sintered alloy formed by coating a film (for example, film in which one kind of film among a carbide, a nitride, a carbon oxide, and a nitrogen oxide of Ti, an oxide of Al, and a mutual solid solution body is formed as two or more of multiple layers) on a surface of the body of the sintered alloy by a chemical vapor deposition method is obtained. Next, there is proposed that, by performing shot peening or sandblasting with respect to a coated surface of the coated sintered alloy, a high-strength coated sintered alloy in which a compressive stress of 30 to 80 kg/mm$^2$ is applied to the hard phase existing on a surface portion of the body, and a compressive stress of 20 kg/mm$^2$ or less is applied to the film or no compressive stress is applied is obtained.

In this high-strength coated sintered alloy, impact resistance, strength, and fracture resistance of the entire alloy are improved by a balance between the compressive stress applied to the hard phase existing on the surface portion of the body and the compressive stress applied to the film or the film to which the compression is not applied. In particular, the former hard phase to which a compressive stress of 30 to 80 kg/mm$^2$ is applied has an effect of preventing growth of minute cracks generated in the film during the process of forming the film or minute cracks generated in the film due to an impact force applied from a coated surface to apply stress into the body. In addition, the latter film to which a compressive stress of 20 kg/mm$^2$ or less is applied or to which no compressive stress is applied has a two-step protection effect of preventing generation of new minute cracks in practical use, and preventing growth of the minute cracks into the body by the latter hard phase, even in a case where new minute cracks are generated in the film.

Patent Document 4 discloses a cutting tool insert of a titanium-based carbonitride, including a wear-resistant CVD layer of one layer or a plurality of layers consisting of a carbide, a nitride, an oxide, and a boride of Ti, Al, Zr, Hf, V, Nb, Ta, Cr, Mo, W, Si, and B elements, a combination thereof, or a solid solution body thereof, in which a total coating thickness is 1 to 20 μm. There is provided a coated tool in which the formed film has no cooling cracks, the CVD layer of one layer or a plurality of layers has the same crystal structure and a thickness less than 1 μm, and has a compressive residual stress of 0 to 1,000 Mpa, preferably 100 to 800 Mpa, and more preferably 200 to 500 Mpa at room temperature. This coated tool has high toughness, wear resistance, and chemical stability.

As means for applying the compressive residual stress described above, component composition of titanium-based carbonitride is adjusted, for example, a component content is adjusted so that an atomic fraction of C and N satisfies a relationship of $0<N/(N+C)<0.6$ and preferably $0.1<N/(N+C)<0.6$ and an atomic fraction of Ti and W satisfies a relationship of $0<W/(Ti+W)<0.4$. In addition, in the titanium-based carbonitride containing C, N, Ti, W, and Co, the amount of each element is adjusted so as to satisfy atomic fractions of $0.25<N/(C+N)<0.5$, $0.05<W/(W+Ti)<0.11$, and $0.09<Co<0.14$.

CITATION LIST

Patent Literature

[Patent Document 1]
  Japanese Examined Patent Application, Second Publication No. H7-88569

[Patent Document 2]
  Japanese Unexamined Patent Application, First Publication No. H4-300104
[Patent Document 3]
  Japanese Unexamined Patent Application, First Publication No. H6-108258
[Patent Document 4]
  Published Japanese Translation No. H11-511078 of the PCT International Publication

SUMMARY OF INVENTION

Technical Problem

In recent years, the performance of a cutting device has been remarkably improved, while there is a strong demand for labor saving, energy saving, and cost reduction for cutting. Along with this, the cutting tends to be faster and more efficient, and a coated tool is required to have more abnormal damage resistance such as chipping resistance, fracture resistance, and peeling resistance, and excellent wear resistance during long-term use.

However, in the coated tool proposed in Patent Document 1, a hard coating layer having a small compressive residual stress is formed by the PVD method, but under the cutting conditions in which a thermal load such as rapid heating and rapid cooling and a mechanical high load are exerted on a cutting edge, the occurrence of chipping is not avoidable and wear resistance is also not sufficient, because the hard coating layer does not have sufficient hardness.

In addition, Patent Document 2 proposes a coated tool in which, by using a TiCN-based cermet as a body and performing sandblasting, shot peening, and ion irradiation with respect to a surface of a hard coating layer, a tensile residual stress or a compressive residual stress of at least one layer of the hard layer (may also be the entire hard layer) is set to 9 kgf/mm$^2$ or less. In addition, Patent Document 3 proposes a coated tool in which, a TiC-based cermet or a TiCN-based cermet is used as a body and performing sandblasting and shot peening with respect to a surface of a hard coating layer, a compressive stress of 30 to 80 kg/mm$^2$ is applied to a hard phase of a surface portion of the body, while a compressive stress of 20 kg/mm$^2$ or less is applied or no compressive stress is applied to a film. However, in a case where the coated tools proposed in Patent Documents 2 and 3 are subjected to cutting conditions in which a high load is exerted on a cutting edge together with a heat cycle of rapid heating and rapid cooling, the cutting edge becomes hot and wear progresses. The cracks on a surface of the hard coating layer formed during a stress relaxation treatment of a CVD film by sandblasting, shot peening, or the like are likely to be starting points of chipping and fracture, so that the fracture resistance and wear resistance are not sufficient.

In addition, in the coated tool proposed in Patent Document 4, the composition of the constituent components of the TiCN-based cermet is adjusted and thermal expansion of the body is set to be larger than that of the CVD layer, and accordingly, a predetermined compressive residual stress is applied to the CVD layer formed on the surface of the body. Therefore, in Patent Document 4, toughness, wear resistance, and chemical stability of the coated tool are improved without causing generation of cooling cracks in the CVD layer. However, in a case where this coated tool is subjected to cutting in which a thermal load due to rapid heating and rapid cooling is exerted on the cutting edge together with an intermittent and impact load, the cutting edge becomes hot and wear progresses rapidly, resulting in short tool life.

That is, the coated tools of the related art proposed in Patent Documents 1 to 4 using the cermet as the body exhibits some extent of effect during the cutting under normal conditions, however, in a case where the coated tools are subjected to cutting conditions in which intermittent and impact mechanical loads are exerted on the cutting edge as in the wet high-speed milling of alloy steel and a thermal load (thermal impact) due to a heat cycle of rapid heating and rapid cooling is exerted, chipping and wear occurs, thereby reaching the end of life.

Solution to Problem

Therefore, in order to solve the above problems, the present inventors conducted intensive studies to provide a surface-coated cutting tool in which, even in a case of being subjected to a wet high-speed milling of alloy steel, excellent chipping resistance is exhibited and excellent wear resistance during long-term use is exhibited, and found the following.

As shown in Patent Documents 1 to 4, a TiCN-based cermet is currently the mainstream as a body of the surface-coated cutting tool using the cermet as the body.

For example, in Patent Document 4, the component composition of the TiCN-based cermet is adjusted so that a coefficient of thermal expansion of the body is larger than that of the CVD layer to apply the compressive residual stress to the CVD layer, thereby improving toughness, wear resistance, and chemical stability of the coated tool without causing cooling cracks in the CVD layer. However, under the cutting conditions in which a heat cycle of rapid heating and rapid cooling acts along with an intermittent and impact mechanical loads on the cutting edge, thermal cracks are generated due to the thermal impact acting on the cutting edge, and this causes chipping and shortening of the tool life.

Therefore, in order to further improve the performance of the surface-coated cutting tool, the generation of thermal cracks is suppressed by quickly releasing heat from the cutting edge that has become hot due to heat generated during cutting, and it is desirable that the occurrence of chipping is suppressed.

That is, as the surface-coated cutting tool suitable for use under cutting conditions in which intermittent and impact mechanical loads are exerted on the cutting edge and the heat cycle of rapid heating and rapid cooling is exerted, it is required to use a cermet body, not only having a linear expansion coefficient so as to apply a large compressive residual stress to the hard coating layer formed on the surface of the body, but also having high thermal conductivity capable of preventing generation of thermal cracks by quickly releasing the heat of the cutting edge.

From the intensive studies on a cermet body that satisfies such requirements, the present inventors found that, by adjusting the component composition of the TiN-based cermet, the linear expansion coefficient can be increased to $9.0 \times 10^{-6}$/K (herein, temperature range of room temperature to 1273 K) or more and a cermet body consisting of the TiN-based cermet having high thermal conductivity in which the thermal conductivity is 30 W/m·K or more is obtained.

Here, a linear expansion coefficient of a normal TiCN-based cermet is approximately $8.0 \times 10^{-6}$/K (herein, the temperature range of room temperature to 1273 K), and the thermal conductivity is approximately 20 W/m·K or less. From this, it can be said that the TiN-based cermet has a large linear expansion coefficient and a high thermal conductivity, compared to the TiCN-based cermet.

It is found that, in a case where the surface-coated TiN-based cermet cutting tool is manufactured by using a TiN-based cermet having the linear expansion coefficient and thermal conductivity as a body and coating and forming the hard coating layer (for example, first layer or second layer of titanium carbonitride layer and aluminum oxide layer) on a surface thereof by a chemical vapor deposition method, a compressive residual stress of 600 to 2,000 MPa is formed in the hard coating layer in an as-deposited state in which no particular treatment such as sandblasting or shot peening is not performed after coating and forming the hard coating layer.

In addition, it is found that, in a case where the surface-coated TiN-based cermet cutting tool is subjected to the cutting such as a wet high-speed milling of alloy steel in which intermittent and impact mechanical loads are exerted on a cutting edge, and a thermal load (thermal impact) due to a heat cycle of rapid heating and rapid cooling is received, no abnormal damage such as chipping or fracture is generated on the cutting edge and excellent cutting performance during long-term use is exhibited.

The present invention has been made based on the above findings.

(1) A surface-coated TiN-based cermet cutting tool of the present invention, includes a body; and a hard coating layer formed on a surface of the body, in which a TiN-based cermet containing a TiN phase as a hard phase component is used as the body, and the hard coating layer includes at least one layer of a titanium carbonitride layer and an aluminum oxide layer, and in which the body has a linear expansion coefficient of $9.0 \times 10^{-6}$ (/K) or more and a thermal conductivity of 30 (W/m·K) or more, and each of the titanium carbonitride layer and the aluminum oxide layer constituting the hard coating layer has a residual compressive stress of 600 to 2,000 MPa.

(2) The surface-coated TiN-based cermet cutting tool according to (1), in which each of the titanium carbonitride layer and the aluminum oxide layer constituting the hard coating layer preferably has a residual compressive stress of 600 to 2,000 MPa in an as-deposited state.

(3) The surface-coated TiN-based cermet cutting tool according to (1) or (2), in which it is preferable that, the TiN-based cermet consists of 70 to 94 area % of the TIN phase, 1 to 25 area % of a $Mo_2C$ phase, and a remainder of a binder phase, a component of the binder phase consists of Fe and Ni, a total area ratio of Fe and Ni is 5 to 15 area %, and the amount of Ni with respect to the total amount of Fe and Ni is 15 to 35 mass %.

Advantageous Effects of Invention

In the surface-coated TiN-based cermet cutting tool of the present invention, the body is configured with the TiN-based cermet, the body has a linear expansion coefficient of $9.0 \times 10^{-6}$ (/K) or more and thermal conductivity of 30 (W/m K) or more, and the hard coating layer formed on the surface of the body has a residual compressive stress of 600 to 2,000 MPa. In particular, the hard coating layer has a residual compressive stress of 600 to 2,000 MPa even in the as-deposited state (state in which no special treatment such as sandblasting or shot peening is performed after the hard coating layer is coated). Therefore, in a case of being subjected to the cutting such as a wet high-speed milling of alloy steel in which intermittent and impact mechanical loads are exerted on a cutting edge, and a thermal load (thermal impact) due to a heat cycle of rapid heating and rapid cooling is received, no abnormal damage such as chipping or fracture is generated on the cutting edge and excellent wear resistance during long-term use is exhibited.

DESCRIPTION OF EMBODIMENTS

Next, a surface-coated TiN-based cermet cutting tool of the present invention (hereinafter, also referred to as a "coated TiN-based cermet tool") will be described in more detail with the following embodiments.

TiN-Based Cermet Body:

The body of the coated TiN-based cermet tool of the present embodiment is configured with a TiN-based cermet. The TiN-based cermet body has a linear expansion coefficient of $9.0 \times 10^{-6}$ (/K) or more and a thermal conductivity of 30 (W/m·K) or more by adjusting its component composition.

Here, in a case where the linear expansion coefficient of the TiN-based cermet body is less than $9.0 \times 10^{-6}$ (/K), it is difficult to introduce a residual compressive stress of 600 MPa or more into a hard coating layer, and accordingly, sufficient chipping resistance cannot be applied. In a case where the thermal conductivity of the TiN-based cermet body is less than 30 (W/m·K), the high heat of the cutting edge cannot be quickly released, and thermal impact resistance to the heat cycle of rapid heating and rapid cooling is decreased, and as a result, the life is shortened due to the generation of thermal cracks and occurrence of chipping.

Accordingly, the linear expansion coefficient of the TiN-based cermet body is set to $9.0 \times 10^{-6}$ (/K) or more, and the thermal conductivity of the TiN-based cermet body is set to 30 (W/m·K) or more.

The preferred linear expansion coefficient is $9.5 \times 10^{-6}$ to $10.5 \times 10^{-6}$ (/K), and the preferred thermal conductivity is 35 to 45 (W/m·K).

In addition, by setting the linear expansion coefficient of the TIN-based cermet body to $9.0 \times 10^{-6}$ (/K) or more, a hard coating layer is formed on the surface of the TIN-based cermet body, and then a residual compressive stress of the hard coating layer is 600 MPa or more, thereby exhibiting excellent chipping resistance. On the other hand, in a case where the residual compressive stress is a large value exceeding 2,000 MPa, in a case where the hard coating layer is thickened (for example, in a case where the film is thickened to exceed 10 μm), self-destruction is likely to occur.

Therefore, the residual compressive stress of the hard coating layer is set to 600 MPa to 2,000 MPa and preferably 800 MPa to 1,500 MPa.

The hard coating layer of the present embodiment has the predetermined compressive residual stress in the as-deposited state, and compressive residual stress of the hard coating layer may be further additionally applied within the range of the predetermined compressive residual stress by performing the surface treatment such as sandblasting and shot peening to the surface of the hard coating layer, after forming the hard coating layer.

The hard coating layer of the coated TiN-based cermet tool of the present embodiment preferably includes at least one layer of a titanium carbonitride layer and an aluminum oxide layer formed by a chemical vapor deposition method. The residual compressive stress of the hard coating layer in this case is a residual compressive stress of the hard coating layer (for example, residual compressive stress of the titanium carbonitride layer and/or the residual compressive stress of the aluminum oxide layer) measured in a state in which the hard coating layer is coated on the surface of the body by the chemical vapor deposition method no special treatment such as sandblasting or shot peening is performed after the coating, that is, the as-deposited state.

The hard coating layer of the present embodiment preferably includes at least one layer of the titanium carbonitride layer and the aluminum oxide layer formed by the chemical vapor deposition method described above, but for other hard coating layer, it does not exclude that the hard layer well known in the related art such as a titanium compound layer such as a titanium carbide layer or a titanium nitride layer, a composite nitride layer or a composite oxide layer of titanium and aluminum, or a composite nitride layer or a composite oxide layer of chromium and aluminum is coated.

The linear expansion coefficient of the TiN-based cermet body can be measured, for example, with a dilatometer, and the thermal conductivity of the TiN-based cermet body can be measured, for example, with a xenon flash analyzer.

In addition, the residual compressive stress of the hard coating layer (preferably, titanium carbonitride layer and/or the aluminum oxide layer) can be calculated by measurement using X-ray diffraction using Cu-Kα ray ($\lambda$=1.5418 Å) as a ray source by $\sin^2\Psi$ method under conditions of a scan step: 0.013 degrees and measurement time per step: 0.48 sec/step.

Specifically, for example, in a case where the hard coating layer includes an aluminum oxide layer, the residual compressive stress can be calculated by using a diffraction peak of a (1310) plane of aluminum oxide, using a Young's modulus of 384 GPa and a Poisson's ratio of 0.232. In addition, in a case where the hard coating layer includes the titanium carbonitride layer, the residual compressive stress can be calculated by using the diffraction peak of a (422) plane of titanium carbonitride, using a Young's modulus of 475 GPa and a Poisson's ratio of 0.2.

As the TiN-based cermet having the linear expansion coefficient and thermal conductivity, for example, a TiN-based cermet consisting of 70 to 94 area % of a TiN phase, 1 to 25 area % of a $Mo_2C$ phase, and a remainder of a binder phase, in which a component of the binder phase consists of Fe and Ni, a total area ratio of Fe and Ni is 5 to 15 area %, and a amount of Ni with respect to a total amount of Fe and Ni is 15 to 35 mass % can be used.

It is generally said that a TiN-based cermet is inferior to a TiCN-based cermet in terms of sinterability and toughness, and is therefore unsuitable as a body for a surface-coated cutting tool. However, by sintering the TiN-based cermet having the component composition under the sintering conditions which will be described later, a cermet body for a surface-coated cutting tool having excellent sinterability and toughness and having a predetermined linear expansion coefficient and thermal conductivity can be manufactured.

The component composition of the TiN-based cermet will be described below.

Tin Phase:

In a case where the area ratio of the TiN phase to the TiN-based cermet body is less than 70 area %, the hardness of the body is not sufficient. On the other hand, in a case where the area ratio of the TiN phase exceeds 94 area %, fine voids (pores) are likely to be formed in the sintered structure, and the toughness is lowered. Therefore, the area ratio of the TiN phase in the TIN-based cermet body is preferably 70 to 94 area %. Compared to the TiCN-based cermet known in the related art, the TiN-based cermet of the present embodiment increases the linear expansion coefficient and thermal conductivity to apply the residual compressive stress to the coating layer and improve the thermal impact resistance of the body, and the high linear expansion coefficient and thermal conductivity are largely caused by the properties of TiN. The linear expansion coefficient and thermal conductivity of TiC are lower than those of TiN, and TiCN has properties intermediate between TiC and TiN depending on a ratio of C and N. Therefore, in this embodiment, it is important to use TiN that does not contain C or has an extremely low C content. The area ratio of the TiN phase is more preferably 80 to 90 area %.

In the present embodiment, a cross section of the TiN-based cermet body is observed with a scanning electron microscope (SEM) equipped with an energy dispersive X-ray analyzer (EDS), and a containing element amount of an area in the obtained secondary electron image (for example, area of 100 $\mu m^2$) is measured, the TiN phase, the $Mo_2C$ phase, and Fe—Ni phase are specified, the area ratio of each phase to the area is calculated, the area ratio in a plurality of areas of at least 5 or more areas are calculated, thereby setting the average value thereof as area of each phase.

$Mo_2C$ Phase:

In a case where the area ratio of the $Mo_2C$ phase in the TIN-based cermet body is less than 1 area %, wettability between the TiN phase and the binder phase is insufficient and voids are formed in the sintered structure, and accordingly, the toughness is lowered. On the other hand, in a case where the area ratio of the $Mo_2C$ phase exceeds area %, double carbides such as $Fe_3Mo_3C$ phase and double nitrides such as $FeMo_3N$ phase are likely to be generated, which causes a decrease in toughness. Therefore, the area ratio $Mo_2C$ phase in the TiN-based cermet body is preferably in 1 to 25 area % and more preferably 2 to 10 area %.

Binder Phase:

In a case where the area ratio of the binder phase in the TiN-based cermet body is less than 5 area %, the amount of the binder phase is small, and accordingly, the toughness of the TiN-based cermet body is lowered. On the other hand, in a case where the area ratio of the binder phase exceeds 15 area %, the amount of TiN phase, which is a hard phase component, is relatively reduced, and accordingly, the hardness required for the body cannot be ensured.

Therefore, the area ratio of the binder phase to the TiN-based cermet body is preferably 5 to 15 area % and more preferably 7 to 10 area %.

In addition, in the present invention, by setting an amount of Ni to a total amount of Fe and Ni constituting the binder phase (={Ni/(Fe+Ni)}×100) to 15 to 35 mass %, the toughness and hardness of the TiN-based cermet body can be further increased.

This is because that, in a case where the amount of Ni to the total amount of Fe and Ni (={Ni/(Fe+Ni)}×100) is less than 15 mass %, Ni is subjected to solid solution in Fe, but the hardness of the binder phase is not sufficient, since an effect of solid-solution reinforcing the binder phase is not exhibited, and on the other hand, in a case where the amount of Ni to the total amount of Fe and Ni (={Ni/(Fe+Ni)}×100) exceeds 35 mass %, intermetallic compound $FeNi_3$ is likely to be generated, thereby lowering the toughness of the binder phase.

The amount of Ni to the total amount of Fe and Ni constituting the binder phase is more preferably 20 to 25 mass %.

Manufacturing of Coated TiN-Based Cermet Tool:

In manufacturing the coated TiN-based cermet tool of the present embodiment, for example, in order to obtain component composition and the like of each phase of the TiN phase, the $Mo_2C$ phase, and the binder phase, first, as a raw material powder, a raw material powder having components and composition, TiN: 55 to 92 mass %, $Mo_2C$: 1 to mass %, Fe: 5 to 18 mass %, Ni: 1 to 5 mass %, and mass % of Ni to the total amount of Ni and Fe (=Ni×100/(Fe+Ni)) satisfies a relationship of 15 to 35 mass % is suitably used.

Then, the raw material powder satisfying the conditions described above is mixed by a ball mill, and the mixed powder is press-molded to prepare a pressed powder molded body.

Then, the pressed powder molded body is sintered in a temperature range of 1,350° C. to 1,450° C. for 30 minutes to 120 minutes while flowing a mixed gas having a hydrogen concentration of 1 to 3 volume % and a nitrogen concentration of 97 to 99 volume % (nitrogen-diluted hydrogen atmosphere), then cooled to 1,200° ° C. at a speed of 10° C./min, and further naturally cooled to room temperature, thereby manufacturing the TiN-based cermet body of the present embodiment having both excellent toughness and hardness.

The reason why the pressed powder molded body is sintered in the nitrogen-diluted hydrogen atmosphere is to improve the wettability between the TiN powder and Fe, which is the most component of the binder phase, and at the same time to improve the sinterability.

Next, the TiN-based cermet body is charged into a chemical vapor deposition apparatus, and a hard coating layer (preferably including a titanium carbonitride layer and/or an aluminum oxide layer) is vapor-deposited.

The total thickness of the hard coating layer is preferably 20 μm or less and more preferably 10 to 15 μm.

The vapor deposition conditions of the hard coating layer are not particularly limited, but for example, the titanium carbonitride layer can be formed under the vapor deposition conditions of
reaction gas (volume %):
$TiCl_4$: 2%, $CH_3CN$: 0.7%, $N_2$: 10%, $H_2$: remainder,
reaction pressure: 7 kPa, and
reaction temperature: 900° C.

In addition, the aluminum oxide layer can be formed under the vapor deposition conditions of
reaction gas (volume %):
$AlCl_3$: 2.2%, $CO_2$: 5.5%, HCl: 2.2%,
$H_2S$: 0.2%, $H_2$: remainder,
reaction pressure: 7 kPa, and
reaction temperature: 1,000° C.

A coated TiN-based cermet tool can be manufactured by forming the hard coating layer by vapor deposition and then machining it into a predetermined shape.

Then, by manufacturing the coated TiN-based cermet tool in the step described above, a surface-coated TiN-based cermet cutting tool in which the linear expansion coefficient of the TiN-based cermet body is $9.0×10^{-6}$ (/K) or more, the thermal conductivity is 30 (W/m K) or more, and the vapor-deposited hard coating layer has a residual compressive stress of 600 to 2,000 MPa in the as-deposited state can be obtained. Even in a case where the surface-coated TiN-based cermet cutting tool is subjected to the cutting such as a wet high-speed milling of alloy steel in which intermittent and impact mechanical loads are exerted on a cutting edge, and a thermal load (thermal impact) due to a heat cycle of rapid heating and rapid cooling is received, no abnormal damage such as chipping or fracture is generated on the cutting edge and excellent wear performance during long-term use is exhibited.

EXAMPLES

Next, the coated TiN-based cermet tool of the present invention will be described in more detail with reference to examples.

As an example of the present invention, an example in which the titanium carbonitride layer and/or the aluminum oxide layer is coated and formed on the surface of the cermet body by chemical vapor deposition as the hard coating layer, is described, but as the hard coating layer, a titanium compound layer such as a titanium carbide layer and/or a titanium nitride layer, a composite nitride layer or a composite oxide layer of titanium and aluminum, or a composite nitride layer or a composite oxide layer of chromium and aluminum can also be coated, in addition to the titanium carbonitride layer and/or the aluminum oxide layer.

As powders for manufacturing the TiN-based cermet body, a TiN powder having an average particle diameter of 10 μm, a $Mo_2C$ powder having an average particle diameter of 2 μm, a Fe powder having an average particle diameter of 2 μm, and a Ni powder having an average particle diameter of 1 μm were prepared and blended to have a blending ratio shown in Table 1, and blended so that the blending ratio of the Fe powder and the Ni powder is a blending ratio shown in Table 1, thereby preparing raw material powders 1 to 8. The average particle diameter here means a median diameter (d50).

Next, the raw material powders 1 to 8 were filled in a ball mill and mixed to prepare mixed powders 1 to 8, and the mixed powders 1 to 8 were dried and then press-molded at a pressure of 100 to 500 MPa to manufacture pressed powder molded bodies 1 to 8.

Next, the pressed powder molded bodies 1 to 8 were sintered under conditions shown in Table 2 and then cooled to room temperature, to manufacture TiN-based cermet bodies of the present invention (hereinafter referred to as "present invention bodies") 1 to 8 shown in Table 3.

For comparison, various powders having the same average particle diameters as the tool of the present invention were blended so as to have the blending composition shown in Table 4 to prepare raw material powders 11 to 18, and then the raw material powders 11 to 18 were filled and mixed in a ball mill to prepare mixed powders 11 to 18, and the mixed powders 11 to 18 were dried and press-molded at a pressure of 100 to 500 MPa to produce pressed powder molded bodies 11 to 18. As the TiCN powder, a powder having a C:N ratio of 50:50 (herein, atomic ratio) was used.

Next, the pressed powder molded bodies 11 to 18 were sintered under conditions shown in Tables 2 and 5, and then cooled to room temperature to manufacture cermet bodies of comparative example (hereinafter, referred to as "comparative example bodies") 11 to 18 shown in Table 6.

Next, regarding each of the present invention bodies 1 to 8 and the comparative example bodies 11 to 18, a cross section thereof was observed with a scanning electron microscope (SEM) equipped with an energy dispersive X-ray analyzer (EDS), and a containing element amount of a measurement area in the obtained secondary electron image (for example, a measurement area of 100 μm×100 μm) was measured, the TIN phase or TiCN phase, the $Mo_2C$ phase, and Fe—Ni phase were specified, the area ratio of each phase to the measurement area was calculated, the area ratios in 5 measurement areas were calculated, and the average value of these calculated values was obtained as area % of each phase in the sintered structure.

In addition, regarding the Fe—Ni phase, the Ni content and the Fe content in the phase were measured at 10 points on the Fe—Ni phase using an Auger electron spectrometer, and the obtained calculated values were averaged. From the value, the amount of Ni to the total amount of Fe and Ni (=Ni×100/(Fe+Ni)) was obtained as mass %.

Tables 3 and 6 show these values.

In addition, regarding the present invention bodies 1 to 8 and the comparative example bodies 11 to 18, alumina was used as a comparative sample and a coefficient of average linear expansion (/K), in a case where the temperature is increased from 300 K to 1,273 K at a temperature increase rate of 5° C. per minute was measured by using a dilatometer, and SUS310 was used as a comparative sample, and thermal conductivity was measured under conditions of a measurement temperature of 25° C. and Xe lamp voltage of 270 V by using a xenon flash analyzer.

Tables 3 and 6 show these values.

TABLE 1

| Type of raw material powder | Blending composition (mass %) | | | | Blending ratio of Ni powder (% by mass) Ni × 100/(Fe + Ni) |
|---|---|---|---|---|---|
| | TiN powder | Mo$_2$C powder | Fe powder | Ni powder | |
| 1 | 85.0 | 4.0 | 8.7 | 2.3 | 20.9 |
| 2 | 83.0 | 4.0 | 10.0 | 3.0 | 23.1 |
| 3 | 58.5 | 35.3 | 5.0 | 1.2 | 19.4 |
| 4 | 59.5 | 21.5 | 15.2 | 3.8 | 20.0 |
| 5 | 91.2 | 1.6 | 5.8 | 1.4 | 19.4 |
| 6 | 83.0 | 4.0 | 8.5 | 4.5 | 34.6 |
| 7 | 83.0 | 4.0 | 11.0 | 2.0 | 15.4 |
| 8 | 52.0 | 40.0 | 4.0 | 4.0 | 50.0 |

TABLE 2

| Sintering condition | Sintering temperature (° C.) | Sintering time (min) | Hydrogen concentration (volume %) | Nitrogen concentration (volume %) |
|---|---|---|---|---|
| 1 | 1400 | 60 | 2 | 98 |
| 2 | 1450 | 30 | 1 | 99 |
| 3 | 1350 | 120 | 3 | 97 |
| 4 | 1400 | 90 | 3 | 97 |

TABLE 3

| Type of Present invention body | Type of sintering condition | Component composition of body | | | | Coefficient of linear expansion of body (×10$^{-6}$/K) | Thermal conductivity of body (W/m · K) |
|---|---|---|---|---|---|---|---|
| | | TiN (area %) | Mo$_2$C (area %) | Binder phase | | | |
| | | | | Fe – Ni (area %) | Ni × 100/ (Fe + Ni) (mass %) | | |
| 1 | 1 | 89.7 | 2.5 | 7.8 | 20.9 | 9.6 | 35.4 |
| 2 | 2 | 88.2 | 2.5 | 9.3 | 23.1 | 9.6 | 36.3 |
| 3 | 3 | 70.0 | 25.0 | 5.0 | 20.0 | 9.3 | 54.4 |
| 4 | 4 | 70.0 | 15.0 | 15.0 | 20.0 | 9.7 | 50.7 |
| 5 | 1 | 94.0 | 1.0 | 5.0 | 20.0 | 9.5 | 32.6 |
| 6 | 2 | 88.3 | 2.5 | 9.2 | 34.6 | 9.6 | 36.3 |
| 7 | 3 | 88.1 | 2.5 | 9.4 | 15.4 | 9.6 | 36.2 |
| 8 | 4 | 64.3 | 29.3 | 6.4 | 50.0 | 9.3 | 59.2 |

TABLE 4

| Type of raw material powder | Blending composition (% by mass) | | | | Blending ratio of Ni powder (% by mass) Ni × 100/(Fe + Ni) |
|---|---|---|---|---|---|
| | TiCN powder | Mo$_2$C powder | Fe powder | Ni powder | |
| 11 | 85.0 | 4.0 | 6.5 | 4.5 | 40.9 |
| 12 | 87.0 | 0.0 | 10.0 | 3.0 | 23.1 |
| 13 | 52.0 | 40.0 | 6.0 | 2.0 | 25.0 |
| 14 | 90.0 | 0.0 | 7.0 | 3.0 | 30.0 |
| 15 | 94.0 | 2.0 | 3.0 | 1.0 | 25.0 |
| 16 | 83.0 | 4.0 | 9.5 | 3.5 | 26.9 |
| 17 | 83.0 | 4.0 | 12.0 | 1.0 | 7.7 |
| 18 | 80.0 | 10.0 | 8.0 | 2.0 | 20.0 |

TABLE 5

| Sintering condition | Sintering temperature (° C.) | Sintering time (min) | Hydrogen concentration (volume %) | Nitrogen concentration (volume %) |
|---|---|---|---|---|
| 11 | 1400 | 60 | 0 | 100 |
| 12 | 1500 | 60 | 2 | 98 |
| 13 | 1300 | 120 | 3 | 97 |
| 14 | 1400 | 90 | 10 | 90 |

TABLE 6

| Type of comparative example body | Type of sintering condition | Component composition of body | | | | Coefficient of linear expansion of body ($\times 10^{-6}$/K) | Thermal conductivity of body (W/m · K) |
|---|---|---|---|---|---|---|---|
| | | TiCN (area %) | Mo$_2$C (area %) | Fe – Ni (area %) | Ni × 100/ (Fe + Ni) (mass %) | | |
| 11 | 1 | 89.9 | 2.5 | 7.6 | 40.9 | 8.7 | 31.9 |
| 12 | 2 | 90.9 | 0.0 | 9.1 | 23.1 | 8.7 | 30.3 |
| 13 | 3 | 64.2 | 29.2 | 6.6 | 25.0 | 8.7 | 56.6 |
| 14 | 4 | 93.1 | 0.0 | 6.9 | 30.0 | 8.7 | 29.0 |
| 15 | 13 | 96.1 | 1.2 | 2.7 | 25.0 | 8.5 | 27.7 |
| 16 | 12 | 88.3 | 2.5 | 9.2 | 26.9 | 8.8 | 32.7 |
| 17 | 14 | 88.1 | 2.5 | 9.4 | 7.7 | 8.7 | 32.7 |
| 18 | 11 | 86.3 | 6.4 | 7.3 | 20.0 | 8.7 | 35.2 |

Next, the present invention bodies 1 to 8 and the comparative example bodies 11 to 18 were charged into a chemical vapor deposition apparatus, and the hard coating layers of the film types shown in Tables 7 and 8 were formed by vapor deposition with an average layer thickness shown in Tables 7 and 8 as a single layer structure or a multiple layer structure.

Here, the hard coating layer is formed by vapor deposition as a single layer structure or a multiple layer structure of up to four layers, but the number of layers is not limited, and a laminated structure of a larger number of layers may be used.

In addition, although there is no particular limitation on the vapor deposition conditions for the hard coating layer, the chemical vapor deposition conditions for titanium carbonitride and aluminum oxide in the present invention bodies 1 to 8 and the comparative example bodies 11 to 18 are as follows.

[Titanium Carbonitride]
reaction gas (volume %):
TiCl$_4$: 2%, CH$_3$CN: 0.7%, N$_2$: 10%, H$_2$: remainder,
reaction pressure: 7 kPa, and
reaction temperature: 900° C.

[Aluminum Oxide]
reaction gas (volume %):
AlCl$_3$: 2.2%, CO$_2$: 5.5%, HCl: 2.2%,
H$_2$S: 0.2%, H$_2$: remainder,
reaction pressure: 7 kPa, and
reaction temperature: 1,000° ° C.

After forming the hard coating layer by vapor deposition, coated TiN-based cermet tools of the present invention (hereinafter, referred to as "present invention tools") 1 to 8 shown in Table 7 and coated cermet tools of the comparative examples (hereinafter, referred to as "comparative example tools") 11 to 18 shown in Table 8 having an insert shape of ISO standard SEEN1203AFSN were manufactured by performing grinding work.

Regarding the hard coating layer in the as-deposited state of the present invention tools 1 to 8 and the comparative example tools 11 to 18 after completing the vapor deposition, the X-ray diffraction was performed using a Cu-Kα ray ($\lambda=1.5418$ Å) as a ray source by sin$^2\Psi$ method under the conditions of a scan step: 0.013 degrees and measurement time per step: 0.48 sec/step, and a value of the residual stress of the hard coating layer was measured and calculated.

For example, regarding the hard coating layer consisting of the aluminum oxide layer, the residual stress was calculated by using a diffraction peak of a (1310) plane, using a Young's modulus of 384 GPa and a Poisson's ratio of 0.232. For example, regarding the hard coating layer consisting of the titanium carbonitride layer, the residual stress was calculated by using a diffraction peak of a (422) plane, using a Young's modulus of 475 GPa and a Poisson's ratio of 0.2.

Tables 7 and 8 show these values.

In the tables, the residual compressive stress is shown as a positive value, and the residual tensile stress is shown as a negative value.

After the above residual stress measurement, the present invention tools 1 and 2 and the comparative example tools 1 and 2 were subjected to wet blast treatment to treat the surface of the coating layer.

The residual stresses of the TiCN layer and the Al$_2$O$_3$ layer of the present invention tools 1 and 2 and the comparative example tools 1 and 2 after the wet blast treatment were as follows.

Present Invention Tool 1
   TiCN layer: 770 MPa (increased by 20 MPa compared to the as-deposited state)
   Al$_2$O$_3$ layer: 1,060 MPa (increased by 40 MPa compared to the as-deposited state)

Present Invention Tool 2
   TiCN layer: 1,090 MPa (increased by 30 MPa compared to the as-deposited state)
   Al$_2$O$_3$ layer: 1,350 MPa (increased by 50 MPa compared to the as-deposited state)

Comparative Example Tool 1

TiCN layer: 240 MPa (increased by 20 MPa compared to the as-deposited state)
   Al$_2$O$_3$ layer: 420 MPa (increased by 60 MPa compared to the as-deposited state)

Comparative Example Tool 2

TiCN layer: 540 MPa (increased by 20 MPa compared to the as-deposited state)
   Al$_2$O$_3$ layer: 590 MPa (increased by 40 MPa compared to the as-deposited state)

| Type of present invention tool | Type of present body | Type of sintering condition | Hard coating layer | | | | | | | | | | | | |
|---|---|---|---|---|---|---|---|---|---|---|---|---|---|---|---|
| | | | First layer | | | Second layer | | | Third layer | | | Fourth layer | | | |
| | | | Film type | Average layer thickness (μm) | Residual stress (MPa) | Film type | Average layer thickness (μm) | Residual stress (MPa) | Film type | Average layer thickness (μm) | Residual stress (MPa) | Film type | Average layer thickness (μm) | Residual stress (MPa) | |
| 1 | 1 | 1 | TiN | 0.2 | — | TiCN | 10.0 | 750 | Al₂O₃ | 5.0 | 1020 | — | — | — | |
| 2 | 2 | 2 | TiN | 0.2 | — | TiCN | 6.0 | 1060 | Al₂O₃ | 3.0 | 1300 | TiN | 0.2 | — | |
| 3 | 3 | 3 | TiN | 0.2 | — | TiC | 0.5 | — | Al₂O₃ | 5.0 | 620 | — | — | — | |
| 4 | 4 | 4 | TiN | 1.0 | — | TiCN | 5.0 | 1570 | Al₂O₃ | 2.0 | 1910 | — | — | — | |
| 5 | 5 | 1 | TiN | 1.0 | — | TiCN | 12.0 | 700 | TiN | 0.1 | — | — | — | — | |
| 6 | 6 | 2 | TiN | 0.5 | — | TiCN | 8.0 | 1250 | Al₂O₃ | 4.0 | 1230 | TiN | 0.2 | — | |
| 7 | 7 | 3 | TiN | 0.5 | — | TiCN | 8.0 | 1130 | TiCNO | 0.2 | — | Al₂O₃ | 8.0 | 1170 | |
| 8 | 8 | 4 | TiN | 0.5 | — | TiCN | 5.0 | 920 | TiCNO | 0.2 | — | Al₂O₃ | 10.0 | 1060 | |

| Type of comparative example tool | Type of comparative example body | Type of sintering condition | Hard coating layer | | | | | | | | | | | | |
|---|---|---|---|---|---|---|---|---|---|---|---|---|---|---|---|
| | | | First layer | | | Second layer | | | Third layer | | | Fourth layer | | | |
| | | | Film type | Average layer thickness (μm) | Residual stress (MPa) | Film type | Average layer thickness (μm) | Residual stress (MPa) | Film type | Average layer thickness (μm) | Residual stress (MPa) | Film type | Average layer thickness (μm) | Residual stress (MPa) | |
| 11 | 11 | 1 | TiN | 0.2 | — | TiCN | 10.0 | 220 | Al₂O₃ | 5.0 | 360 | — | — | — | |
| 12 | 12 | 2 | TiN | 0.2 | — | TiCN | 6.0 | 520 | Al₂O₃ | 3.0 | 550 | TiN | 0.2 | — | |
| 13 | 13 | 3 | TiN | 0.2 | — | TiC | 0.5 | — | Al₂O₃ | 5.0 | 60 | — | — | — | |
| 14 | 14 | 4 | TiN | 1.0 | — | TiCN | 5.0 | 20 | Al₂O₃ | 2.0 | 50 | — | — | — | |
| 15 | 15 | 13 | TiN | 1.0 | — | TiCN | 12.0 | −120 | Al₂O₃ | 7.0 | −80 | — | — | — | |
| 16 | 16 | 12 | TiN | 0.5 | — | TiCN | 8.0 | 560 | TiN | 0.2 | — | — | — | — | |
| 17 | 17 | 14 | TiN | 0.5 | — | TiCN | 8.0 | 470 | TiCNO | 0.2 | — | Al₂O₃ | 8.0 | 510 | |
| 18 | 18 | 11 | TiN | 0.5 | — | TiCN | 5.0 | 50 | TiCNO | 0.2 | — | Al₂O₃ | 10.0 | 50 | |

Next, the present invention tools 1 to 8 and the comparative example tools 11 to 18 were all subjected to a wet milling test of alloy steel shown below, while being screwed to a tip of a tool steel cutter with a fixing jig, a flank face wear width of the cutting edge was measured, and a wear state of the cutting edge was observed.

Cutting Conditions:
  Work material: JIS·SCM440 block,
  Cutting speed: 800 m/min,
  Depth of cut: 1.0 mm,
  Feed: 0.1 mm/rev,
  Cutting time: 15 minutes,
  Table 9 shows the results of the cutting test.

TABLE 9

| Type | flank face wear width (mm) | State of wear of cutting edge | Type | flank face wear width (mm) | Wear state of cutting edge |
|---|---|---|---|---|---|
| Present invention tool | | | Comparative example tool | | |
| 1 | 0.12 | No abnormality | 11 | 0.30 | Chipping |
| 2 | 0.10 | No abnormality | 12 | 0.25 | Chipping |
| 3 | 0.19 | No abnormality | 13 | *8 | Fracture |
| 4 | 0.15 | No abnormality | 14 | *8 | Fracture |
| 5 | 0.19 | No abnormality | 15 | *2 | Fracture |
| 6 | 0.12 | No abnormality | 16 | 0.24 | Chipping |
| 7 | 0.11 | No abnormality | 17 | 0.28 | Chipping |
| 8 | 0.20 | No abnormality | 18 | *7 | Fracture |

*indicates cutting time (min) taken to the end of life.

As shown in Tables 3 and 6 to 9, in each of the present invention tools 1 to 8, the TiN-based cermet body had a predetermined linear expansion coefficient and thermal conductivity (see Table 3), and a predetermined residual compressive stress exists on the hard coating layer (see Table 7), and accordingly, even during the cutting in which intermittent and impact mechanical loads and thermal load (thermal impact) due to heat cycle of rapid heating and rapid cooling are exerted on the cutting edge, chipping for affecting the cutting life did not occur and excellent wear resistance during long-term use was exhibited (see Table 9).

On the other hand, in each of the comparative example tools 11 to 18, the TIN-based cermet body did not have the predetermined linear expansion coefficient and thermal conductivity specified in the invention (see Table 6), or the predetermined residual compressive stress did not exist on the hard coating layer (see Table 8), and accordingly, wear resistance was not sufficient, and also, tool life was shortened due to chipping of the cutting edge mainly caused by the generation and growth of thermal cracks (see Table 9).

INDUSTRIAL APPLICABILITY

Since the surface-coated TiN-based cermet cutting tool of the present invention has excellent chipping resistance and wear resistance, it can be applied not only to high-speed wet intermittent cutting but also as a cutting tool under other cutting conditions. It exhibits excellent cutting performance during long-term use, and can fully and satisfactorily respond to labor saving, energy saving, and cost reduction in cutting.

What is claimed is:

1. A surface-coated TiN-based cermet cutting tool, comprising:
    a body; and
    a hard coating layer formed on a surface of the body,
    wherein a TiN-based cermet containing a TiN phase as a hard phase component is used as the body,
    wherein the hard coating layer includes at least one layer of a titanium carbonitride layer and an aluminum oxide layer,
    wherein the body has a linear expansion coefficient of $9.0 \times 10^{-6}$ (/K) or more and a thermal conductivity of 30 (W/m·K) or more,
    each of the titanium carbonitride layer and the aluminum oxide layer constituting the hard coating layer has a residual compressive stress of 600 to 2,000 MPa,
    wherein the TiN-based cermet consists of 70 to 94 area % of the TiN phase, 1 to 25 area % of a $Mo_2C$ phase, and a remainder of a binder phase,
    a component of the binder phase consists of Fe and Ni,
    a total area ratio of Fe and Ni is 5 to 15 area %, and
    an amount of Ni with respect to a total amount of Fe and Ni is 15 to 35 mass %.

2. The surface-coated TiN-based cermet cutting tool according to claim 1,
    wherein each of the titanium carbonitride layer and the aluminum oxide layer constituting the hard coating layer has a residual compressive stress of 600 to 2,000 MPa in an as-deposited state.

* * * * *